US012598980B2

(12) United States Patent
Mukesh et al.

(10) Patent No.: US 12,598,980 B2
(45) Date of Patent: Apr. 7, 2026

(54) FRONT END OF LINE PROCESSING COMPATIBLE THERMALLY STABLE BURIED POWER RAILS

(71) Applicant: International Business Machines Corporation, Armonk, NY (US)

(72) Inventors: Sagarika Mukesh, Albany, NY (US); Christian Lavoie, Pleasantville, NY (US); Daniel Charles Edelstein, White Plains, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 17/854,444

(22) Filed: Jun. 30, 2022

(65) Prior Publication Data

US 2024/0006316 A1 Jan. 4, 2024

(51) Int. Cl.
| | |
|---|---|
| *H01L 23/528* | (2006.01) |
| *H01L 21/768* | (2006.01) |
| *H01L 23/535* | (2006.01) |
| *H10D 30/67* | (2025.01) |
| *H10D 84/01* | (2025.01) |
| *H10D 84/03* | (2025.01) |
| *H10D 84/85* | (2025.01) |

(52) U.S. Cl.
CPC .... *H01L 23/5286* (2013.01); *H01L 21/76898* (2013.01); *H01L 23/535* (2013.01); *H10D 30/6757* (2025.01); *H10D 84/0186* (2025.01); *H10D 84/038* (2025.01); *H10D 84/853* (2025.01)

(58) Field of Classification Search
CPC ........... H01L 21/76898; H01L 23/535; H10D 30/6757; H10D 84/0186; H10D 84/038; H10D 84/853
See application file for complete search history.

(56) References Cited

U.S. PATENT DOCUMENTS

| | | | |
|---|---|---|---|
| 5,536,684 | A | 7/1996 | Dass et al. |
| 9,570,395 | B1 | 2/2017 | Sengupta et al. |
| 10,199,264 | B2 | 2/2019 | Zhang et al. |
| 10,636,739 | B2 | 4/2020 | Beyne et al. |
| 10,734,224 | B2 | 8/2020 | Smith et al. |
| 11,101,217 | B2 | 8/2021 | Xie et al. |
| 11,222,892 | B2 | 1/2022 | Su et al. |

(Continued)

OTHER PUBLICATIONS

Gupta, A., et al., "High-Aspect-Ratio Ruthenium Lines for Buried Power Rail", International Interconnect Technology Conference (IITC), Jun. 2018, pp. 4-6.

(Continued)

*Primary Examiner* — Jeff W Natalini
*Assistant Examiner* — Rose Keagy
(74) *Attorney, Agent, or Firm* — Scully, Scott, Murphy & Presser, P.C.; L. Jeffrey Kelly, Esq.

(57) ABSTRACT

Semiconductor devices, and methods of their formation, are provided. The semiconductor device can include a substrate; a wiring level within the substrate; and at least one buried power rail within the wiring level, wherein the at least one buried power rail is divided into a plurality of rail segments, wherein each rail segment of the plurality of rail segments has a length smaller than a total length of the buried power rail.

17 Claims, 7 Drawing Sheets

(56)                References Cited

U.S. PATENT DOCUMENTS

| | | | |
|---|---|---|---|
| 11,264,327 B2 | 3/2022 | Chiang et al. | |
| 12,137,548 B2 | 11/2024 | Fujiwara et al. | |
| 2009/0017619 A1 | 1/2009 | Lee et al. | |
| 2018/0145030 A1* | 5/2018 | Beyne | H01L 21/76898 |
| 2019/0057867 A1 | 2/2019 | Smith et al. | |
| 2019/0164882 A1* | 5/2019 | Chen | H10D 84/834 |
| 2020/0135634 A1* | 4/2020 | Chiang | H10D 64/251 |
| 2021/0225768 A1 | 7/2021 | Peng et al. | |
| 2021/0408011 A1 | 12/2021 | Fujiwara et al. | |
| 2022/0037236 A1* | 2/2022 | Seo | H01L 23/5386 |
| 2022/0147679 A1* | 5/2022 | Edathil | G06F 30/398 |

OTHER PUBLICATIONS

Ryckaert, J., et al., "Extending the roadmap beyond 3nm through system scaling boosters: A case study on Buried Power Rail and Backside Power Delivery", 2019 Electron Devices Technology and Manufacturing Conference (EDTM), Date of Conference: Mar. 12-15, 2019, pp. 50-52.

Mathur, R., et al., "Buried Bitline for sub-5nm SRAM Design", 2020 IEEE International Electron Devices Meeting (IEDM), Date of Conference: Dec. 12-18, 2020, 4 pages.

Gupta, A., et al., "Buried Power Rail Scaling and Metal Assessment for the 3 nm Node and Beyond", 2020 IEEE International Electron Devices Meeting (IEDM), Dec. 2020, 4 pages.

Moroz, V., et al., "Can We Ever Get to a 100 nm Tall Library? Power Rail Design for 1nm Technology Node", 2020 IEEE Symposium on VLSI Technology, Date of Conference: Jun. 16-19, 2020, 2 pages.

Prasad, D., et al., "Buried Power Rails and Back-side Power Grids: Arm CPU Power Delivery Network Design Beyond 5 nm", 2019 IEEE International Electron Devices Meeting (IEDM), Dec. 2019, 4 pages.

Mallik, A., et al., "Economics of semiconductor scaling—a cost analysis for advanced technology node", 2019 Symposium on VLSI Technology Digest of Technical Papers, Date of Conference: Jun. 9-14, 2019, 2 pages.

* cited by examiner

FRONT END OF LINE PROCESSING COMPATIBLE THERMALLY STABLE BURIED POWER RAILS

BACKGROUND

The present disclosure generally relates to semiconductor devices, and more particularly, to semiconductor devices that include buried power rails.

Integrated circuit processing can be generally divided into front end of the line (FEOL), middle of the line (MOL) and back end of the line (BEOL) metallization processes. The FEOL and MOL processing will generally form many layers of logical and functional devices. By way of example, the typical FEOL processes include wafer preparation, isolation formation, well formation, gate patterning, spacer formation, extension and source/drain implantation, silicide formation, and dual stress liner formation.

As semiconductor devices scale to smaller dimensions, the ability to harness device improvements with decreased size becomes more challenging. The synthesis of three-dimensional semiconductor transistors, such as fin type field effect transistors (finFET) and nanosheet devices, involves challenging processing issues.

One challenge in scaling semiconductor devices relates to scaling power rails. Power rails typically provide voltage power supplies or provide a circuit ground for logic FET devices. The number of power rails in a logic cell affects the height of the logic cell, and the size of the power rails affect the resistance of the power rails. Scaling a power rail can increase the resistance of the power rail and, thus, increase heat generation within semiconductor devices.

SUMMARY

Embodiments of the present disclosure provide semiconductor devices and methods of forming semiconductor devices.

In one embodiment of the present disclosure, a semiconductor device is provided. The semiconductor device can include a substrate; a wiring level within the substrate; and at least one buried power rail within the wiring level, wherein the at least one buried power rail is divided into a plurality of rail segments, wherein each rail segment of the plurality of rail segments has a length smaller than a total length of the buried power rail.

In another embodiment of the present disclosure, a semiconductor device is provided. The semiconductor device can include a substrate; a wiring level within the substrate; at least one buried power rail within the wiring level, wherein the at least one buried power rail is divided into a plurality of rail segments, wherein each rail segment of the plurality of rail segments has a length smaller than a total length of the buried power rail; and a back side power distribution network (BSPDN) below the wiring level in the substrate, wherein the buried power rail is electrically connected to the BSPDN.

In another embodiment of the present disclosure a method of forming a semiconductor device is provided. The method can include forming a dielectric isolation region surrounding a non-recessed semiconductor portion of a semiconductor substrate; forming a plurality of rail segment trenches within the dielectric isolation region; and forming a plurality of rail segments, each of the plurality of rail segments in one of the plurality of rail segment trenches, wherein the plurality of rail segments include a buried power rail and each of the plurality of rail segments has a length smaller than a total length of the buried power rail.

BRIEF DESCRIPTION OF THE DRAWINGS

Embodiments of the disclosure are described below with reference to the following accompanying drawings.

DETAILED DESCRIPTION

Figures 1, 2:
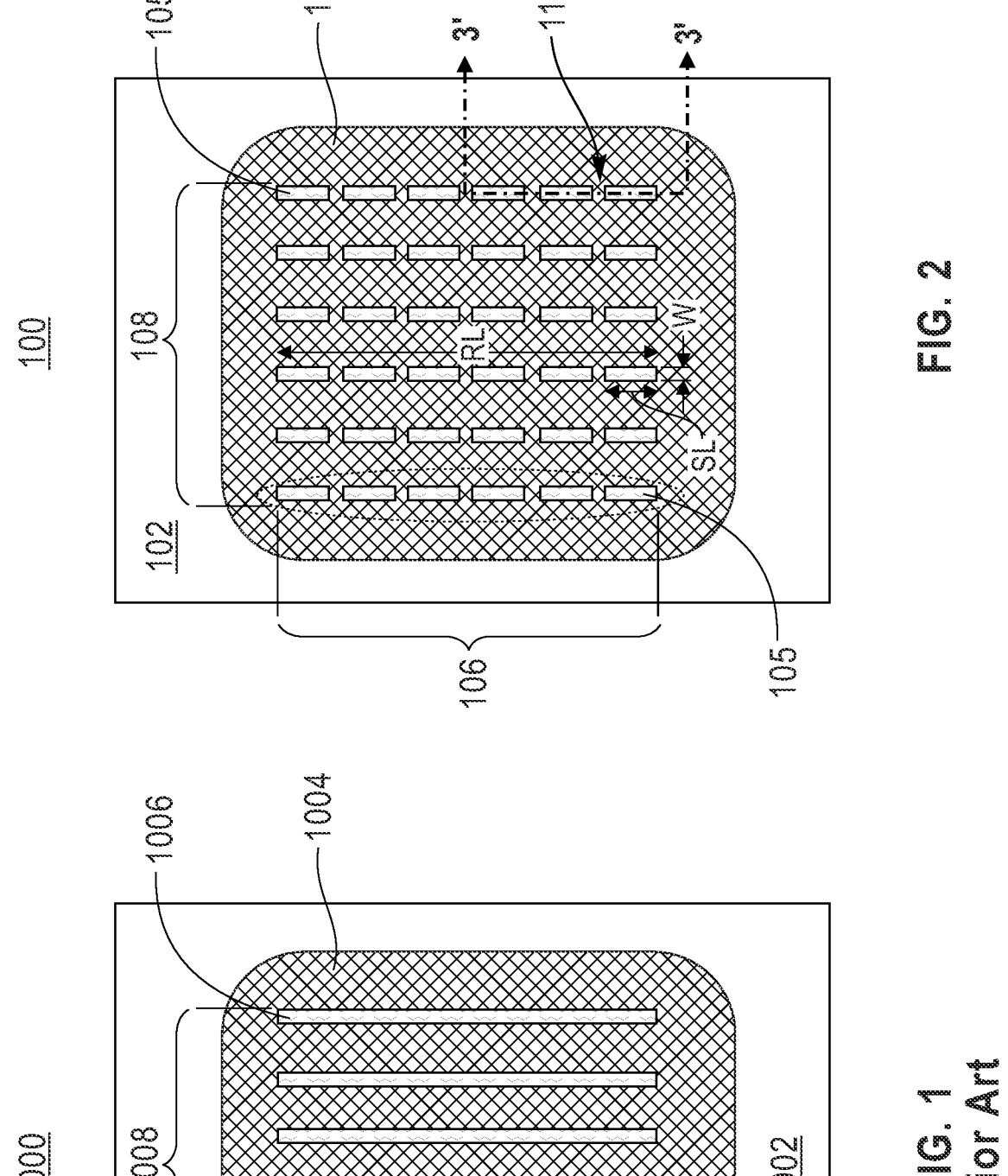
FIG. 1 depicts a top view of a prior art semiconductor structure.
FIG. 2 depicts a top view of a semiconductor structure, of an embodiment of the disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, the term "substantially" is intended to accommodate manufacturing tolerances and indicates that the value listed may be somewhat altered, as long as the alteration does not result in nonconformance of the process or structure to the illustrated embodiment. For example, for some elements the term "substantially" or the term "about" can refer to a comparative variation of ±0.1%, for other elements, the term "substantially" or the term "about" can refer to a comparative variation of ±1% or ±10%, or any point therein.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $SiGe_{1-x}$ where x is less than or equal to 1, etc. In addition, other elements can be included in the compound and still function in accordance with the present principles. The compounds with additional elements will be referred to herein as alloys.

Reference throughout the specification to deposition techniques (including thin-film deposition techniques) for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to photolithography techniques, known in the art of semiconductor fabrication for patterning various thin films, includes a spin-expose-develop process sequence typically followed by an etch process. Alternatively, or additionally, photoresist can also be used to pattern a hard mask (e.g., a silicon nitride hard mask), which, in turn, can be used to pattern an underlying film.

Reference throughout the specification to etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Buried power rails, buried contacts, and the methods of forming the same are provided in accordance with various embodiments. The intermediate stages in the formation of the buried power rails and buried contacts are illustrated in accordance with some embodiments. Some variations of some embodiments are discussed. Throughout the various views and illustrative embodiments, like reference numbers are used to designate like elements.

As used herein the term "plated cobalt" or "plated Co" refers to any cobalt comprising alloy, including at least one base material having a plated layer on at least a portion of the base material, the plated layer comprising at least one of Co, CoWP, CoWB, CoP, CoB, CoWPB, CoMoB, and CoMoP. In other embodiments, the "plated cobalt" material can comprise Fe based structures that include a plating layer comprising Co.

As used herein the term "recrystallized cobalt" or "recrystallized Co" refers to any Co containing material, that upon undergoing an anneal, may recrystallize and reduce the total volume of empty spaces between grains of the Co containing material. The anneal may thus induce an increase in density of the Co containing material and shrinkage of the apparent volume of the Co containing material.

Referring to FIG. 1, a prior art semiconductor device 1000 is shown. This prior art semiconductor device 1000 includes a dielectric isolation region 1002, which surrounds a recessed semiconductor portion 1004. The recessed semiconductor portion 1004 was formerly non-recessed, but a power rail 1006 was formed therein. In this embodiment of the prior art semiconductor device 1000, a plurality of power rails 1008 are formed, each being a Co material.

Each power rail 1006 of the plurality of power rails 1008 has a high length (L) to width (W) ratio, which creates stress during high-temperature processing (100° C. up through 900° C. or 1000° C.) of the prior art semiconductor device 1000. This stress creates defects as a result of a net volume change of the material of the power rail during high-temperature processing, with the power rail typically being formed of a significant volume of material due to the length of a trench the power rail is formed in. This significant volume and high length (L) to width (W) ratio of a typical the power rail 1006 is shown in FIG. 1.

FIG. 2 illustrates a portion of a semiconductor device 100 (hereinafter, "device") of the present disclosure. In this embodiment, the device 100 includes a dielectric isolation region 102, which surrounds a non-recessed portion (i.e., semiconductor fin) of a semiconductor substrate 104. In other embodiments, the semiconductor device 100 can comprise one buried power rail 106, however in FIG. 2, and by way of one example, six buried power rails 106 are included in the plurality of buried power rails 108.

Each buried power rail 106 is divided into a plurality of rail segments 105. Each rail segment 105 of the plurality of rail segments 105 that form the buried power rail 106 has a segment length (SL) smaller than a total rail length (RL) of the buried power rail.

Each rail segment 105 of the plurality of rail segments that form the buried power rail 106 can be formed of any suitably conductive material, such as a material comprising TiN, Ti, Co, W, Ru, Ir, Rh, and combinations thereof. In other embodiments, each rail segment 105 of the plurality of rail segments that form the buried power rail 106 can be formed of any suitably conductive material, such as a material comprising Co. In other embodiments, each rail segment 105 of the plurality of rail segments that form the buried power rail 106 can be formed of any suitably conductive material, such as a material comprising a plated Co, a recrystallized Co, or combinations thereof.

In this embodiment each rail segment 105 of the plurality of rail segments that form the buried power rail 106 has a rail segment length (SL) to a rail segment width (W) ratio of 4 to 10, or about 4 to about 10. In other embodiments, each rail segment 105 of the plurality of rail segments that form the buried power rail 106 has a rail segment length (SL) to a rail segment width (W) ratio of 6 to 8, or about 6 to about 8. In other embodiments, each rail segment 105 of the plurality of rail segments that form the buried power rail 106 has a rail segment length (SL) to a rail segment width (W) ratio of 7, or about 7.

This rail segment length (SL) to rail segment width (W) substantially reduces or eliminates the number of thermo-mechanical stress fails caused by high-temperature process-ing (100° C. up through 900° C. or 1000° C.) as compared to the fails/defects created during high-temperature process-ing of the prior art semiconductor device 1000. This sub-stantial reduction or elimination of thermomechanical stress fails of the buried power rail 106, and its plurality of rail segments 105, is due to a comparatively smaller amount of rail material, which is as a result of smaller rail segment length (SL of FIG. 2) being shorter than the full rail length (FL of FIG. 1). This comparatively smaller amount of rail material changes volume to a lesser degree during high-temperature processing, resulting in a substantial reduction or elimination of thermomechanical stress fails of the buried power rail 106, and each of its plurality of rail segments 105.

Figure 3:
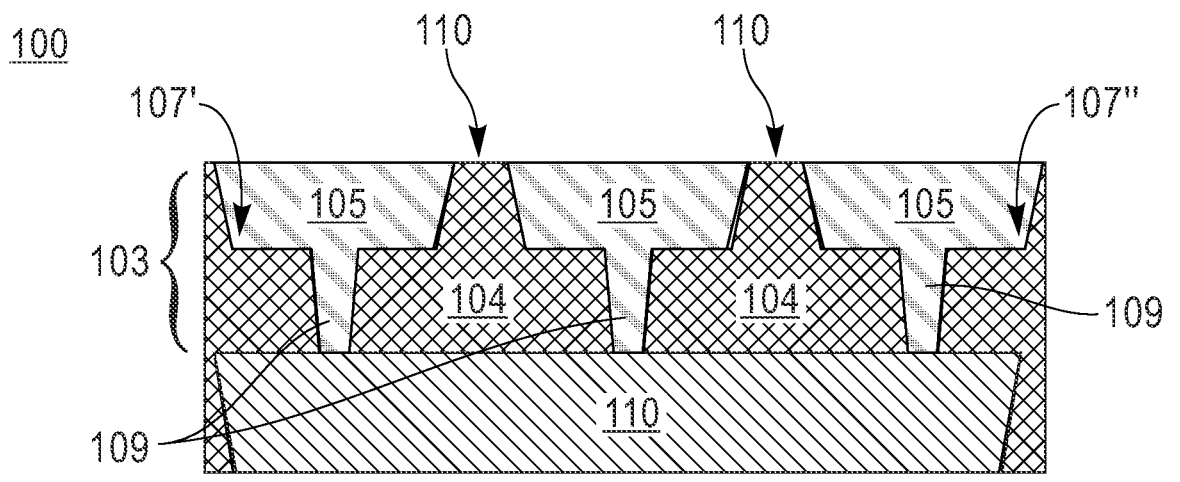
FIG. 3 depicts a cross-section view along line 3' of the semiconductor structure of FIG. 2, of an embodiment of the disclosure.

A cross section of three rail segments 105, along line 3' of FIG. 2, is shown in FIG. 3.

As seen in FIG. 3, the rail segments 105 extend vertically, in a wiring layer 103 of the device 100, through at least a portion of semiconductor substrate 104, filling recesses therein. Although in this view the interfaces 107' and 107" of the semiconductor substrate 104 and the rail segments 105 are not illustrated as being 90°, in other embodiments these interface angles can be any suitable angle including 90° or about 90°.

Each rail segment 105 is electrically connected, through the semiconductor substrate 104, to a back side power distribution network (BSPDN) 110. The BSPDN 110 is below the wiring level 103 in the semiconductor substrate 104, and is electrically connected to each rail segment 105 by a respective interconnect 109.

As can be seen in FIG. 3, each of the rail segments 105 is divided and separated from adjacent rail segments 105 of the same buried power rail. The division/separation of adjacent rail segments 105 is maintained by an exposed section of the semiconductor substrate 104, which is also illustrated in FIG. 2.

Figure 4:
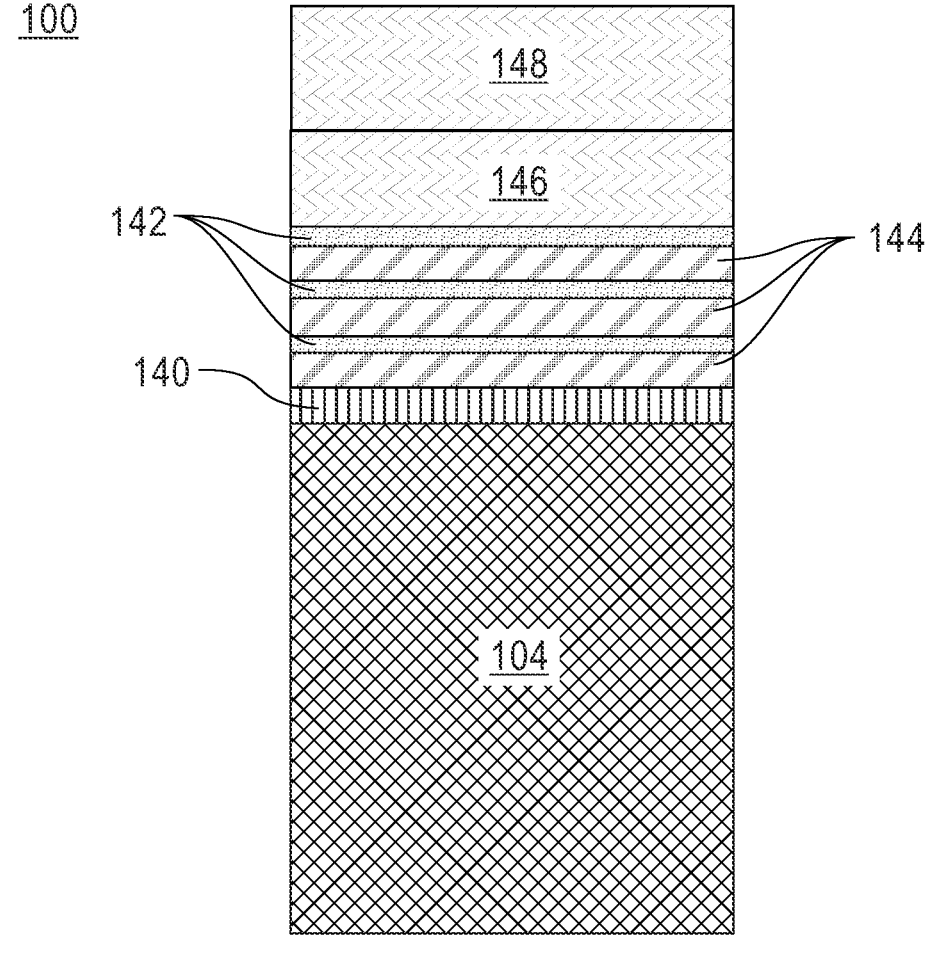
FIG. 4 depicts a cross-section view of the semiconductor structure, of an embodiment of the disclosure.

A method of forming a rail segment 105 is shown in the subsequent figures, beginning with FIG. 4.

In FIG. 4, a cross-sectional view of the non-recessed semiconductor portion of the semiconductor substrate 104 is shown, prior to the method beginning. The semiconductor substrate 104 can be a device region of the semiconductor device 100, which includes various material layers.

In this embodiment of the disclosure, the semiconductor device 100 can include several layers of material on the semiconductor substrate 104, which are shown to illustrate the methods of the present disclosure as an example. Semi-conductor substrate 104 can be composed of a semiconduc-tor material having semiconductor properties. Illustrative examples of semiconductor materials that can be used in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). In one embodiment (depicted in the drawings of the present appli-cation), the semiconductor substrate is entirely composed of at least one semiconductor material. In such an embodiment, the semiconductor substrate 104 can be referred to as a bulk semiconductor substrate. In other embodiments (not shown in the drawings of the present application), semiconductor substrate 104 can be composed of a first semiconductor material layer, a buried insulator layer such as for example, silicon dioxide and/or boron nitride, and a top semiconduc-tor material layer. In such an embodiment, the semiconduc-tor substrate 10 can be referred to as a semiconductor-on-insulator substrate.

As seen in FIG. 4, on the semiconductor substrate 104 is a sacrificial semiconductor placeholder material 140, which can be replaced later in the process with a bottom dielectric isolation layer (not shown). The bottom dielectric isolation layer can be composed of any dielectric material having electrical insulating properties. Illustrative examples of dielectric materials that can be employed in providing the bottom dielectric isolation layer include, but are not limited to, silicon dioxide, silicon nitride, silicon oxynitride, or boron nitride.

Also shown in FIG. 4 are semiconductor channel material layers 142, which are interleaved with sacrificial semiconductor material layers 144, all formed on the sacrificial semiconductor placeholder material 140. These semiconductor channel material layers 142 and sacrificial semiconductor material layers 144 form two vertical nanosheet stacks 143 (shown in FIG. 5). In this embodiment, three semiconductor channel material layers 142 and three sacrificial semiconductor material layers 144 are shown interleaved, however, in other embodiments, one, two, four or more alternating layers may be included.

Each sacrificial semiconductor material layer 144 is composed of a first semiconductor material, while each semiconductor channel material layer 142 is composed of a second semiconductor material that is compositionally different from the first semiconductor material. In some embodiments, the second semiconductor material that provides each semiconductor channel material layer 142 is a semiconductor material that is capable of providing high channel mobility for n-type FET devices. In other embodiments, the second semiconductor material that provides each semiconductor channel material layer 142 is a semiconductor material that is capable of providing high channel mobility for p-type FET devices.

The first semiconductor material that provides each sacrificial semiconductor material layer 144, and the second semiconductor material that provides each semiconductor channel material layer 142 can include one of the semiconductor materials mentioned above for the semiconductor substrate 104. In the present application, the first semiconductor material that provides each sacrificial semiconductor material layer 144 can be compositionally the same as, or compositionally different from, at least an uppermost semiconductor material portion of the semiconductor substrate 104. The second semiconductor material that provides each semiconductor channel material layer 142 can be compositionally the same as, or compositionally different from, at least an uppermost semiconductor material portion of the semiconductor substrate 104. Typically, the second semiconductor material that provides each semiconductor channel material layer 142 is compositionally the same as at least the uppermost semiconductor material portion of the semiconductor substrate 104. In one example, the semiconductor substrate 104 is composed silicon, the first semiconductor material that provides each sacrificial semiconductor material layer 144 is composed of a silicon germanium alloy, and the second semiconductor material that provides each semiconductor channel material layer 142 is composed of silicon. Other combinations of semiconductor materials are possible as long as the first semiconductor material that provides each sacrificial semiconductor material layer 144 is compositionally different from the second semiconductor material that provides each semiconductor channel material layer 142.

The material stack MS can be formed by growing alternating blanket layers of sacrificial semiconductor material and semiconductor channel material on the sacrificial semiconductor placeholder material 140. The placeholder material layer is typically composed of a semiconductor material that is compositionally different from the sacrificial semiconductor material, the semiconductor channel material and the semiconductor substrate, and is subsequently replaced with a dielectric material to provide the bottom dielectric isolation layer. The placeholder material layer is typically formed by an epitaxial growth process. The alternating blanket layers of sacrificial semiconductor material and semiconductor channel material can be deposited utilizing epitaxial growth. The alternating blanket layers of sacrificial semiconductor material and semiconductor channel material and the as deposited placeholder material layer are then patterned by lithography and etching to form a patterned sacrificial placeholder material layer (not shown) and the material stack MS. The etch goes through the alternating blanket layers of sacrificial semiconductor material and semiconductor channel material and the as deposited blanket dielectric material layer, and into a top portion of the semiconductor substrate 104 forming a shallow trench isolation (STI) trench (FIG. 7) at least between different active device regions.

On the interleaved semiconductor channel material layers 142 and sacrificial semiconductor material layers 144, a first hard mask 146 is formed, and then a second hard mask 148 is formed on the first hard mask 146. The first hard mask 146 and the second hard mask 148 are formed of different materials from each other, and can be any suitable hard mask material, such as, for example, silicon dioxide, silicon oxide, silicon nitride, silicon carbide, or any other suitable organic type hard mask and/or inorganic type hard mask.

Figures 5, 6:
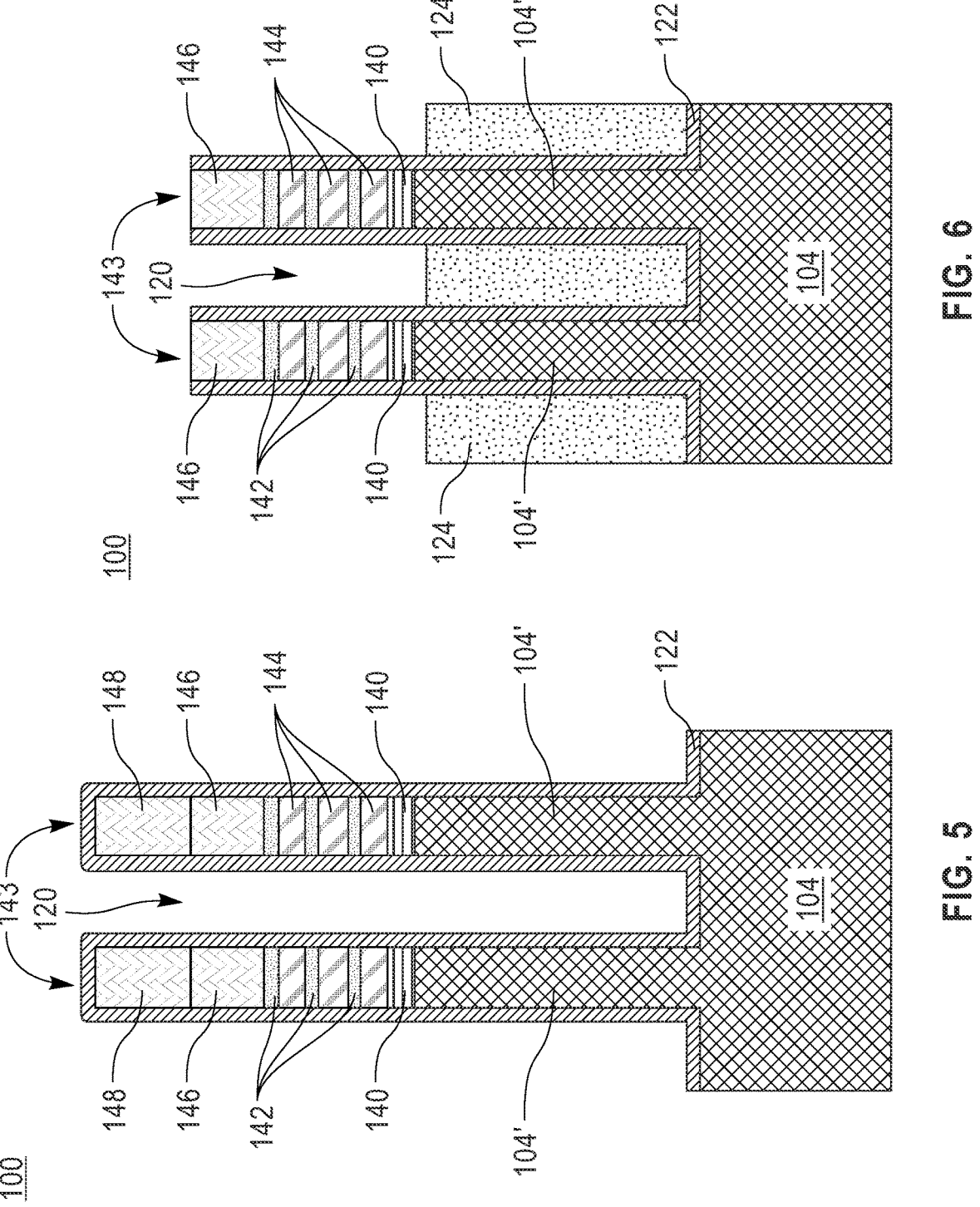
FIG. 5 depicts a cross-section view of the semiconductor structure, of an embodiment of the disclosure.
FIG. 6 depicts a cross-section view of the semiconductor structure, of an embodiment of the disclosure.

Next, a plurality of channels are formed within the non-recessed semiconductor portion of the semiconductor substrate 104, forming two non-recessed fin portions 104'. However, FIG. 5 illustrates formation of a single channel 120 for ease of explanation. The channel 120 can be formed by any suitable etching or patterning procedure. The channel 120 can create a semiconductor fin on either side of the channel, and the channel 120 can create a vertical nanosheet from the material stack shown in FIG. 4.

Optionally, the channel 120, and exposed portions of the semiconductor substrate 104 can have a dielectric liner 122 formed thereon. Dielectric liner 122 can be formed of any suitable material, such as a nitride comprising material.

Next, as shown in FIG. 6, a dielectric isolation region 124 can be formed within the channel 120 and extend at least a portion of the depth of the channel 120. The isolation dielectric region 124 can be formed of any suitable material, such as a material comprising an oxide. This process step also removes the second hard mask 148 and the portion of the dielectric liner 122 on the second hard mask 148.

Figure 7:
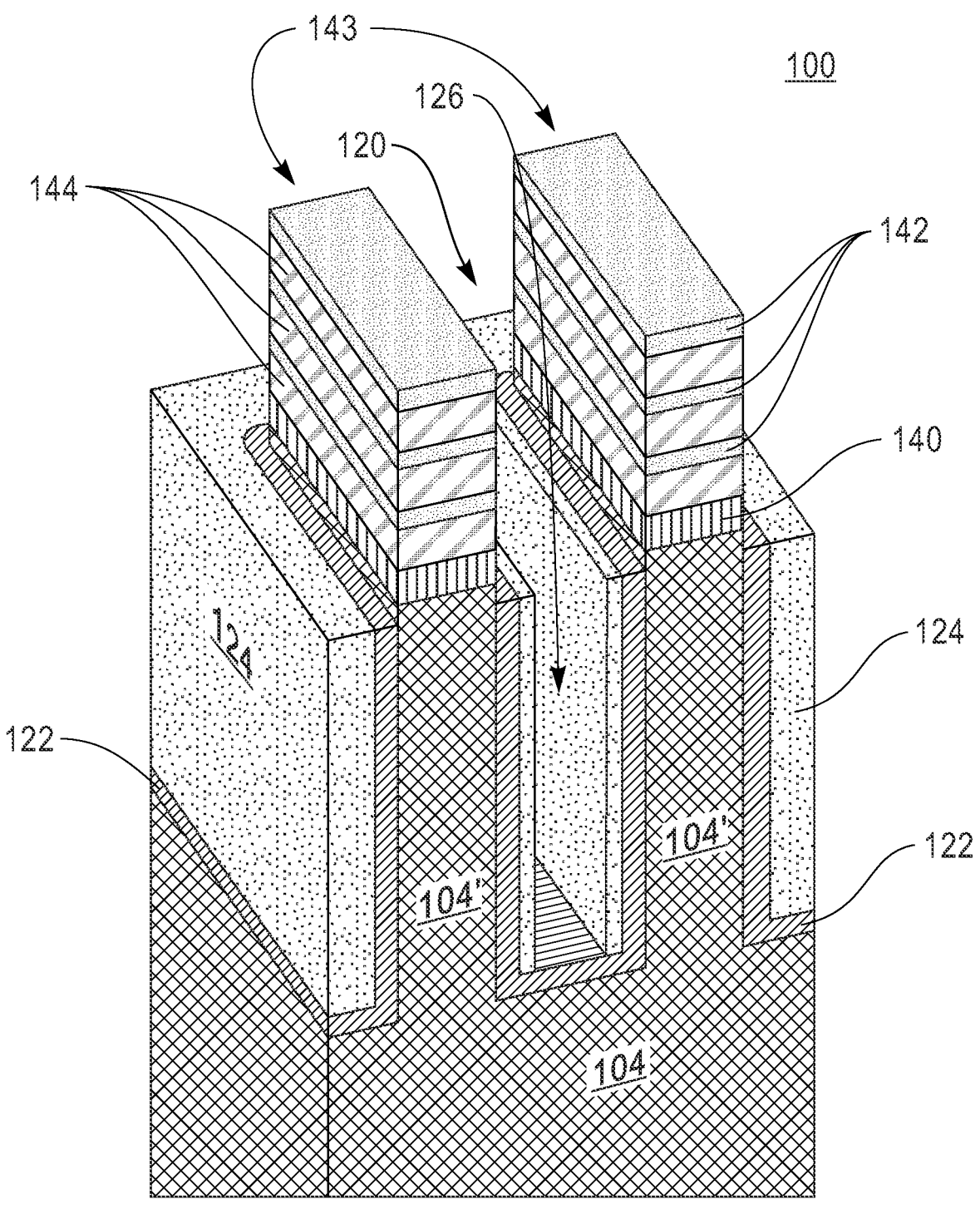
FIG. 7 depicts a perspective cross-section view of the semiconductor structure, of an embodiment of the disclosure.

Next, as shown in FIG. 7, a rail segment trench 126 is formed within the dielectric isolation region 124. The rail segment trench 126 can be formed by any suitable patterning procedure, followed by an etching process. This process step also removes the first hard mask 146 and the portion of the dielectric liner 122 on the first hard mask 146.

Figure 8:
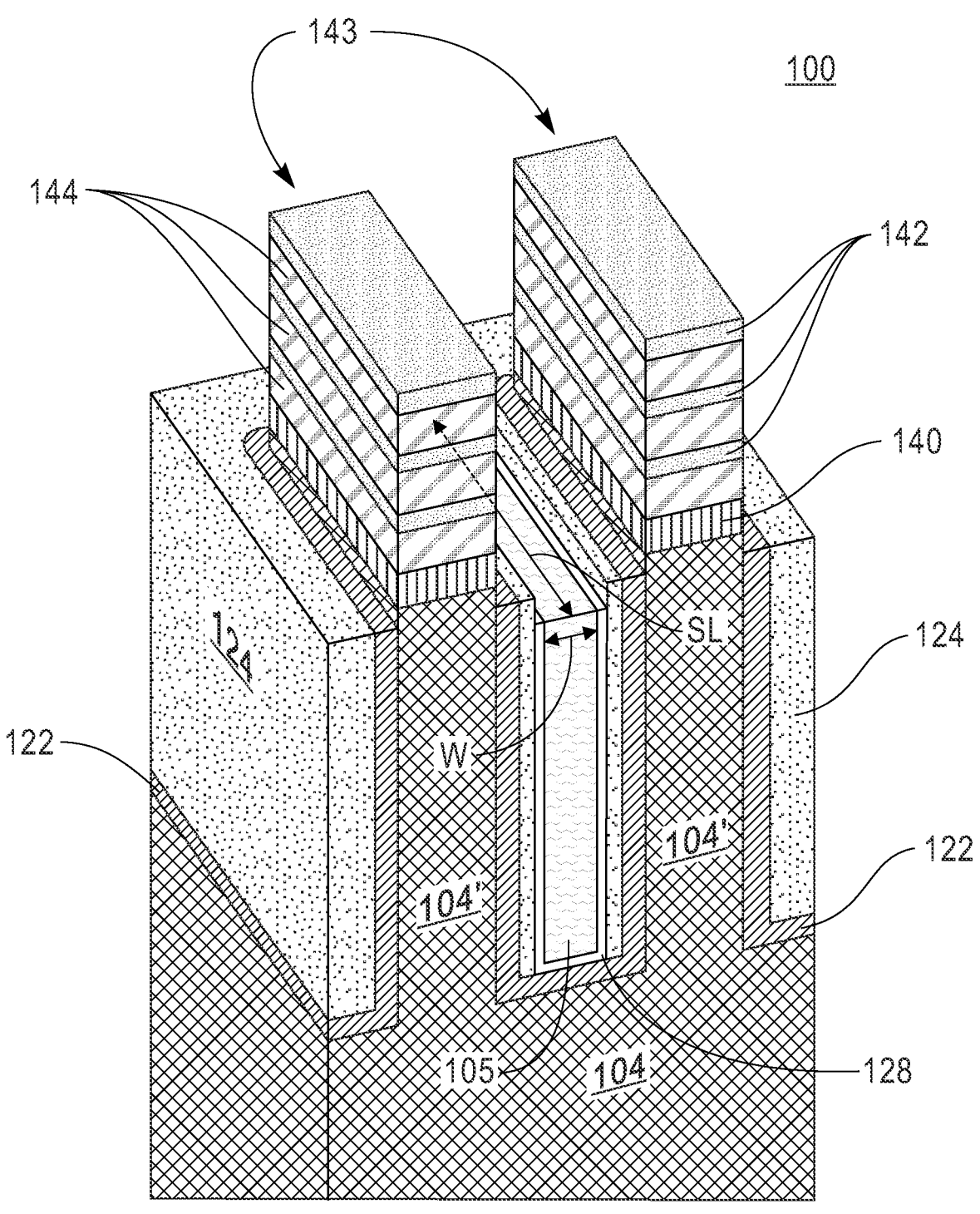
FIG. 8 depicts a perspective cross-section view of the semiconductor structure, of an embodiment of the disclosure.

Next, as shown in FIG. 8, the rail segment 105 is formed in the rail segment trench 126.

Optionally, a diffusion barrier layer 128 can be formed along one or more of a sidewall and a bottom wall of each of the rail segment trench 126 prior to formation of the rail segment 105. This diffusion barrier layer 128 can be any suitable material, such as silicon comprising materials, for example $SiO_2$, $Si_3N_4$, and combinations of $SiO_2$ and $Si_3N_4$.

Figure 9:
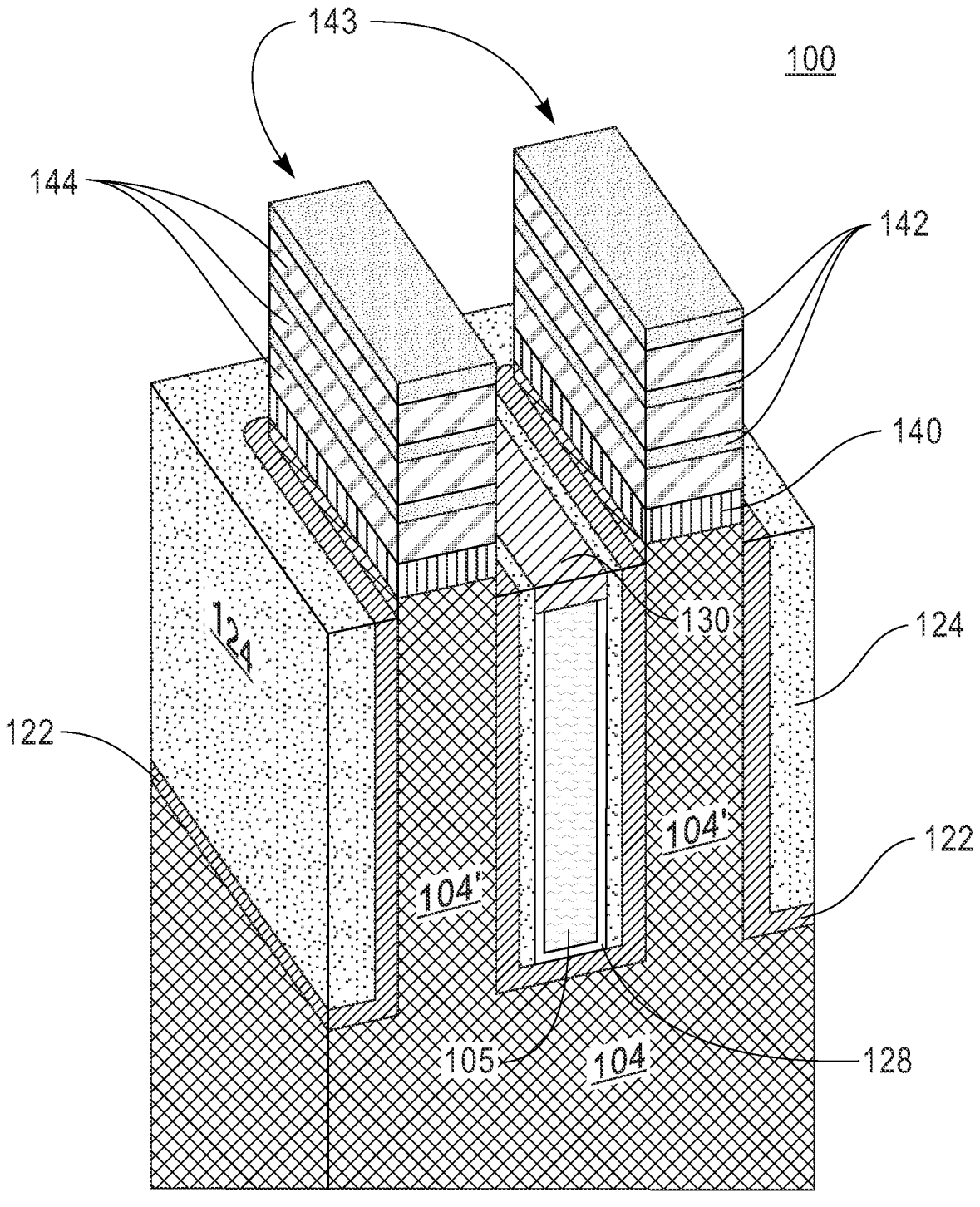
FIG. 9 depicts a perspective cross-section view of the semiconductor structure, of an embodiment of the disclosure.

Next, as shown in FIG. 9, an optional diffusion barrier cap 130 can be formed on an upper surface of each the rail segment 105, and optionally as well as on an upper surface of the diffusion barrier layer 128. The diffusion barrier cap 130 can be any suitable material, such as silicon comprising materials, for example $SiO_2$, $Si_3N_4$, and combinations of $SiO_2$ and $Si_3N_4$.

During or after any step shown in FIGS. 8 and 9, the semiconductor device 100 can undergo an anneal process and/or any high-temperature processing (100° C. up through 900° C. or 1000° C. or higher). Due to the rail segment 105 having a length SL smaller than a total length (RL of FIG. 2) and therefore a smaller volume of material, the volume expansion of the rail segment 105 during the anneal process and/or any high-temperature processing is comparatively smaller than that of power rail 1006 during a comparable processing. This reduced volume expansion results in less or no defects as a result of the processing.

Figures 10, 11:
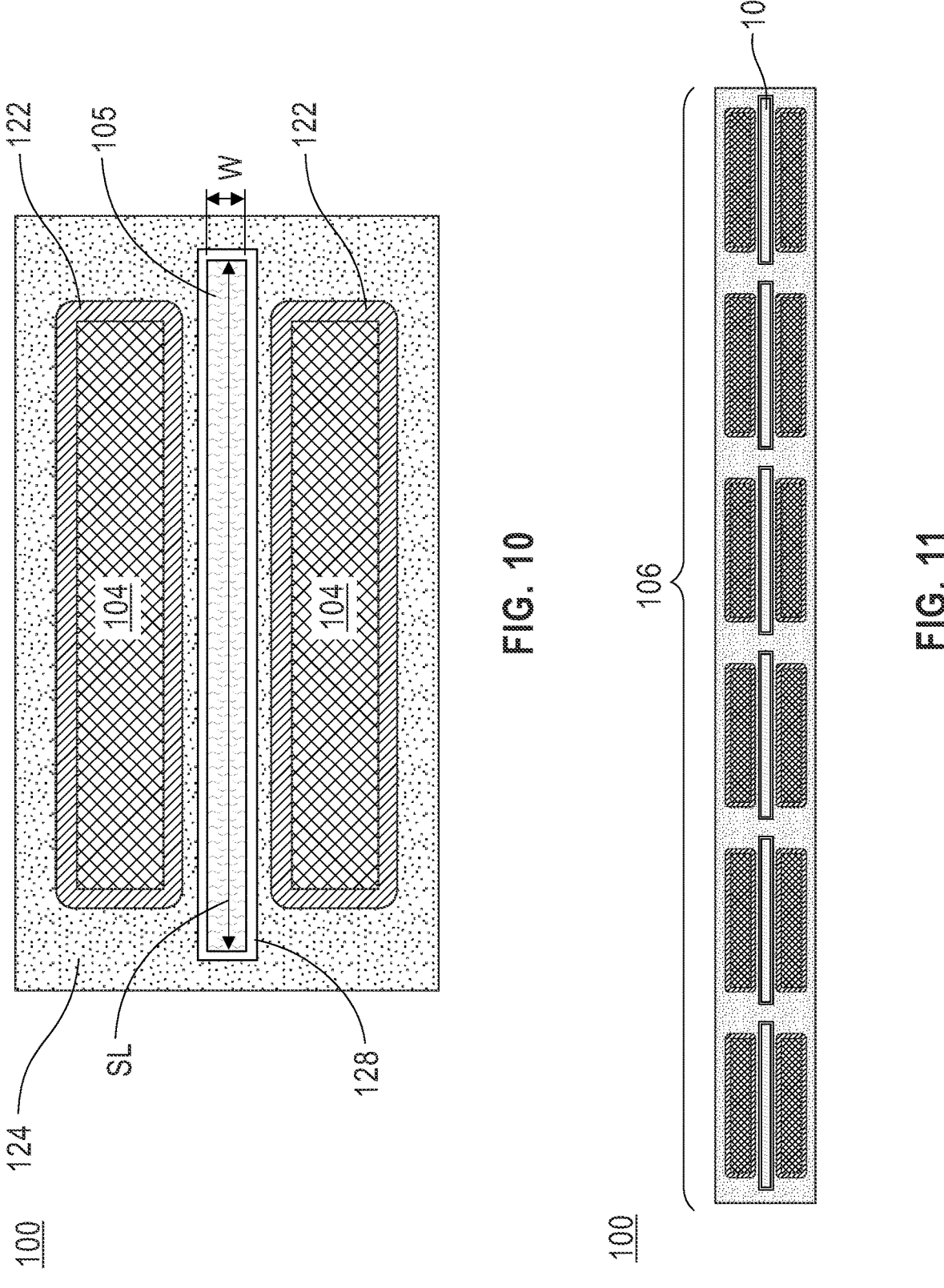
FIG. 10 depicts a top view of a semiconductor structure, of an embodiment of the disclosure.
FIG. 11 depicts a top view of a semiconductor structure, of an embodiment of the disclosure.

FIG. 10 is a top view of the semiconductor device 100 of FIG. 8, with the two vertical nanosheet stacks 143 being reveled.

FIG. 11 is a top view of, in this example, six rail segments 105 of the buried power rail 106. In this embodiment six rail segments 105 are shown, however, in other embodiments a buried power rail 106 can be divided into two, three, four, five, seven or more rail segments 105.

After formation of the buried power rail 106, the buried power rail 106 can be integrated into a structure through any suitable front end of the line (FEOL) metallization process and/or back end of the line (BEOL) metallization processes.

After formation of the buried power rail 106, conventional nanosheet processing can be performed to form a nanosheet device. Although the present application describes and illustrates the formation of a buried power rail 106 in a nanosheet processing flow, the present disclosure is not limited to the same, that the buried power rail 106 of the present disclosure can be formed in other types of devices, i.e., FinFET, nanowire, stacked FETs, etc.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:
   a semiconductor substrate comprising at least one non-recessed semiconductor portion;
   a dielectric isolation region surrounding, but not located on top of, the at least one non-recessed semiconductor portion; and
   at least one buried power rail within the dielectric isolation region, wherein the at least one buried power rail is divided into a plurality of rail segments, wherein each rail segment of the plurality of rail segments has a length smaller than a total length of the at least one buried power rail, and each rail segment has a rail segment length to rail segment width ratio of 4-10.

2. The semiconductor device of claim 1, wherein the at least one buried power rail comprises a plurality of buried power rails.

3. The semiconductor device of claim 1, wherein the rail segment length to rail segment width ratio is 6 to 8.

4. The semiconductor device of claim 1, wherein the rail segment length to rail segment width ratio is 7.

5. The semiconductor device of claim 1, further comprising a diffusion barrier layer located along a sidewall and a bottom wall of each of the plurality of rail segments.

6. The semiconductor device of claim 5, wherein the diffusion barrier layer has a topmost surface that is coplanar with a topmost surface of the dielectric isolation region.

7. The semiconductor device of claim 5, further comprising a diffusion barrier cap on an upper surface of each of the plurality of rail segments.

8. The semiconductor device of claim 7, wherein the diffusion barrier cap has a topmost surface that is coplanar with a topmost surface of the dielectric isolation region.

9. The semiconductor device of claim 1, wherein the at least one buried power rail comprises TiN, Ti, Co, W, Ru, Ir, Rh, and combinations thereof.

10. The semiconductor device of claim 9, wherein the at least one buried power rail comprises a plated Co, a recrystallized Co, or combinations thereof.

11. A semiconductor device comprising:
    a semiconductor substrate comprising at least one non-recessed semiconductor portion;
    a dielectric isolation region surrounding, but not located on top of, the at one non-recessed semiconductor portion;
    at least one buried power rail within the dielectric isolation region, wherein the at least one buried power rail is divided into a plurality of rail segments, wherein each rail segment of the plurality of rail segments has a length smaller than a total length of the at least one buried power rail, and each rail segment has a rail segment length to rail segment width ratio of 4-10;
    an interconnect extending through the semiconductor substrate and in contact with each rail segment of the plurality of rail segments of the at least one buried power rail; and
    a back side power distribution network (BSPDN) below in the semiconductor substrate, wherein the at least one buried power rail is electrically connected to the BSPDN by the interconnect.

12. The semiconductor device of claim 11, further comprising:
    a diffusion barrier layer located on a sidewall and a bottom wall of each of the plurality of rail segments; and
    a diffusion barrier cap on an upper surface of each of the plurality of rail segments.

13. A method of forming a semiconductor device comprising:
    forming a dielectric isolation region surrounding, but not located on top of, a non-recessed semiconductor portion of a semiconductor substrate;
    forming a plurality of rail segment trenches within the dielectric isolation region; and
    forming a plurality of rail segments, each of the plurality of rail segments in one of the plurality of rail segment trenches, wherein the plurality of rail segments comprise a buried power rail and each of the plurality of rail segments has a length smaller than a total length of the buried power rail, and each rail segment has a rail segment length to rail segment width ratio of 4-10.

14. The method of claim 13, wherein the forming of the dielectric isolation region comprises forming a channel in a semiconductor substrate.

15. The method of claim 13, further comprising forming a diffusion barrier layer on a sidewall of the non-recessed semiconductor portion of the semiconductor substrate prior to forming the plurality of rail segments.

16. The method of claim 13, further comprising forming a diffusion barrier cap on an upper surface of each of the plurality of rail segments.

17. The method of claim 13, wherein the rail segment length to rail segment width ratio is from 6 to 8.

* * * * *